United States Patent [19]

Campbell

[11] Patent Number: 4,785,294

[45] Date of Patent: Nov. 15, 1988

[54] STATIC MONITORING SYSTEM

[75] Inventor: Jeffrey D. Campbell, Hawthorne, Calif.

[73] Assignee: Zero Corporation, Burbank, Calif.

[21] Appl. No.: 877,873

[22] Filed: Jun. 24, 1986

[51] Int. Cl.4 ............................................. G08B 21/00
[52] U.S. Cl. ..................... 340/649; 340/561; 340/650; 340/661; 340/635
[58] Field of Search ............... 340/565, 561, 562, 563, 340/541, 564, 573, 649, 650, 635, 661; 361/222, 220, 214, 215, 212

[56] References Cited

U.S. PATENT DOCUMENTS

| | | | |
|---|---|---|---|
| H330 | 9/1987 | Burich et al. | 340/649 |
| 3,973,208 | 8/1976 | Diamond | 340/562 |
| 4,366,473 | 12/1982 | Inoue et al. | 340/562 |
| 4,558,309 | 12/1985 | Antonevich | 340/649 |
| 4,638,399 | 1/1987 | Maroney et al. | 340/649 |
| 4,649,374 | 3/1987 | Hoigaard | 340/573 |
| 4,684,931 | 8/1987 | Parks | 340/563 |
| 4,710,751 | 12/1987 | Webster | 340/562 |

OTHER PUBLICATIONS

Single page ad of Voyager Technologies, Inc.
Quarter page ad of Semtronics.
Two page ad of Simco Model M400.
Two page ad of Electro-Tech Systems, Inc. Model 6025.
Two page ad of Trek Model 1800 and Model 150.
Twelve page catalog of Trek.
Three page ad for Simco Aerostat.

*Primary Examiner*—John W. Caldwell, Sr.
*Assistant Examiner*—Tyrone Queen
*Attorney, Agent, or Firm*—Harris, Kern, Wallen & Tinsley

[57] ABSTRACT

A static monitoring system for use with an electronic manufacturing work area, typically a conventional work bench having an electrical conducting strap for connecting the operator's wrist to earth ground, and including a circuit for indicating when there is an earth ground connection and circuitry for indicating when an electrostatically charged object, such as another human, approaches the work station. An antenna is positioned at the work station spaced from the working surface and from the operator, with the antenna connected as an input to an amplifier circuit which measures the change in electrostatic field strength and hence the approach of a charged object, with an indicator providing a visual or audible alarm or both. An oscillator provides an ac signal to each input of a differential amplifier, with one input connected to circuit ground through a capacitor and the other input connected to a wrist strap or the like on the operator. Phase difference at the amplifier inputs is detected as a measure of the capacitance to ground at the wrist strap thereby indicating appropriate use of the wrist strap.

9 Claims, 7 Drawing Sheets

STATIC MONITORING SYSTEM

BACKGROUND OF THE INVENTION

This invention relates to static monitoring systems for use with an electronic manufacturing work station or in a work area. Many present day electronic assembly procedures are sensitive to electrostatic charges, and a typical work area includes a work bench or table having a grounded surface and a wrist strap or other electrical conductor for connecting the operator to ground. In a typical installation, both the working surface and the operator's wrist strap are connected to earth ground such as may be achieved by direct electrical connection to a cold water pipe. Typically the operator wrist strap is a flexible conductor such as the commonly used expansion metallic wrist watch strap.

A variety of configurations have been proposed for achieving the desired control of static charge. However, problems of sensitivity, false alarms, fail safe operation, and the like have been encountered, and it is an object of the present invention to provide a new and improved static monitoring system which provides the desired indications and control while being substantially unaffected by electrical noise and sufficiently sensitive to indicate approaching charges prior to potential damage to work in progress, and at the same time being substantially free of false alarms which unnecessarily inhibit production, and having fail safe characteristics so that the operator can determine if the system is not functioning properly.

It is an object of the present invention to provide for the detection of potentially hazardous static fields within the proximity of the work area by continuously monitoring the work environment for charges entering the work area. Typically this would be the approach of a fellow worker or supervisor. The charges approaching the work station are detected and an alarm is provided well before the charge gets near static sensitive components at the work station.

Another object of the invention is to provide a system which insures that operators and supervisors are grounded, by continuously monitoring the status of the wrist strap. The system will display a safe indication such as a green light when the wrist strap is being worn and is functioning properly, while displaying a fail or red indication and providing an audible alarm when the desired conditions are not met. Separate wrist strap monitors are provided for the operator and a supervisor, with each strap monitored separately and simultaneously.

It is an object of the invention to provide circuitry for indicating that the connections to earth or cold water ground and to circuit or electrical ground are present. Both earth ground and electrical ground are continuously monitored and compared, with an alarm being provided when the difference exceeds a predetermined value.

SUMMARY OF THE INVENTION

A static monitoring system for use with an electronic manufacturing work area. A system for detecting the approach of a charged object to the work area by measuring the change in field strength adjacent to the work area.

An antenna, means for positioning the antenna adjacent the work area with the antenna output connected as an input to an amplifier and with the amplifier output connected to an alarm unit through a line frequency filter, and a signal level detector. The amplifier is a non-linear operational amplifier which provides an output when the monitored change in electric field exceeds a predetermined value, thereby eliminating the need for precise measurement of the actual magnitude of the field strength.

An oscillator connected to both inputs of a differential amplifier, with one input shunted to ground by a capacitor and with the other input shunted to ground by the operator's body through the wrist strap, with the amplifier and subsequent circuitry providing an alarm output when the phase difference between the signals at the two inputs exceeds a preset value, thereby indicating a change in the balance normally obtaining when the wrist strap is properly in place. An alarm unit for indicating when the wrist strap system is not functioning, including an audible alarm for calling the operator's attention to a change from safe to fail operation.

BRIEF DESCRIPTION OF THE DRAWINGS

FIGS. 6(1), 6(2), 7(1) and 7(2) are electrical schematics of the system of FIG. 1.

DESCRIPTION OF THE PREFERRED EMBODIMENT

Figure 1:
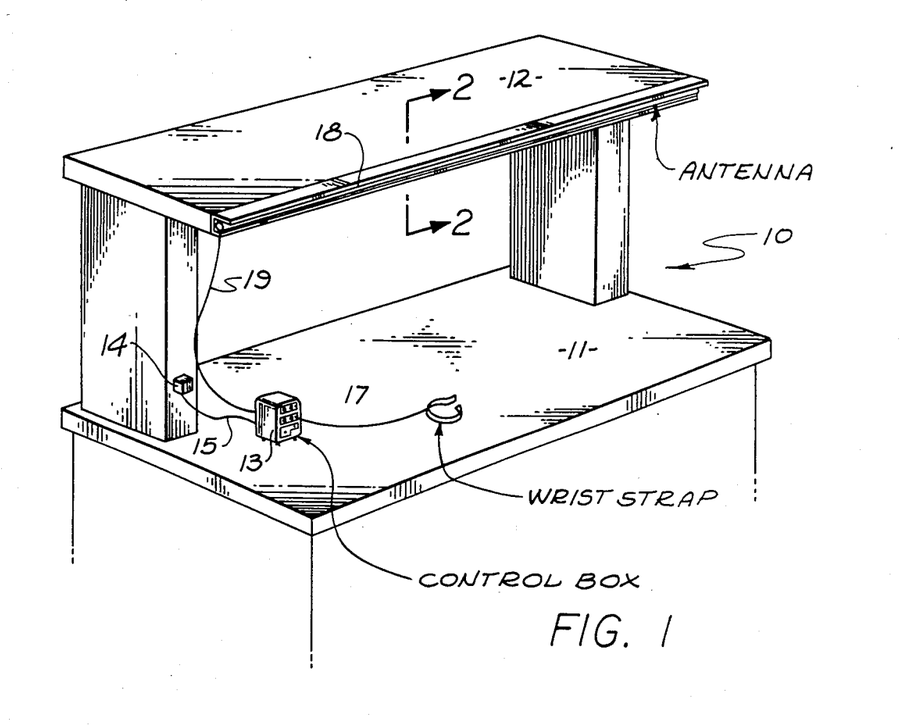
FIG. 1 is a perspective view of a work station with the presently preferred embodiment of the invention installed.

In FIG. 1, the system of the invention is illustrated installed at a work station, typically a work bench 10, having a desk or table top 11 and a shelf 12, both of which typically are connected to ground. A control box 13 rests on the work bench and is connected to an electronic package 14 by a cable 15. A wrist strap 16 is connected to the control box by a cable 17, and an antenna 18 is connected to the control box by another cable 19. In an alternative configuration, the control box can be directly mounted in a pedistal or other component of the work bench. The antenna typically is a metal tube supported on electrical insulators, and preferably is disposed in a horizontal configuration along to entire width of the work station above the work surface 11 and spaced outward from the shelf 12. In the embodiment shown in FIGS. 1 and 2, the antenna 18 is an aluminum tube supported within an electrical conducting shield 20 on three spaced insulators 9 which preferably are formed of teflon or polyethylene. The shield 20 typically is a U-shaped aluminum extension attached to the forward edge of the shelf 12, with an upper flange 20a projecting beyond the antenna 18 to reduce the likelihood of contact with the antenna by wires and other components resting on the shelf. The wrist strap 16 is an elecrical conductor which makes direct electrical contact with the operator, and typically is a buckle strap or an elastic expanding strap, such as the type used with wrist watches.

Figure 3:
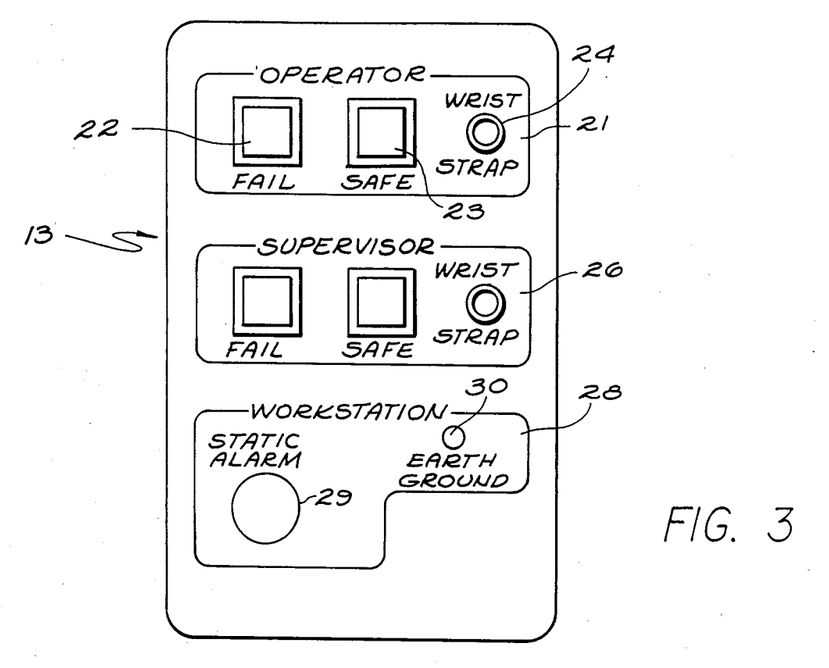
FIG. 3 is a view of the control box and indicating unit for the system of FIG. 1.

The control box 13 contains indicator lights, switches, a beeper or other audible signal source, and jacks for plugging in the conductors 17 of the wrist straps. In the embodiment illustrated, there is an operator section 21 with a FAIL lamp 22, typically red, and a SAFE lamp 23, typically green. A jack 24 provides for receiving the plug of cable 17. In the illustrated embodiment, the lamp units are combination lamp and switch units which are currently available on the market. This permits the operator to actuate switches by pushing on the lamp housing, thereby reducing the frontal space required for the control box. The switches will be described in conjunction with the circuit diagram. A similar supervisor section 26 is provided at the control box 13, so that both the operator working at the work station and a supervisor present in the work area can have a wrist strap. The operator and supervisor sections 21, 26 are identical. A work station section 28 has a static alarm lamp 29 and an earth ground lamp 30. The operation of these lamps will be described in conjunction with the description of the electrical circuitry.

Figure 4:
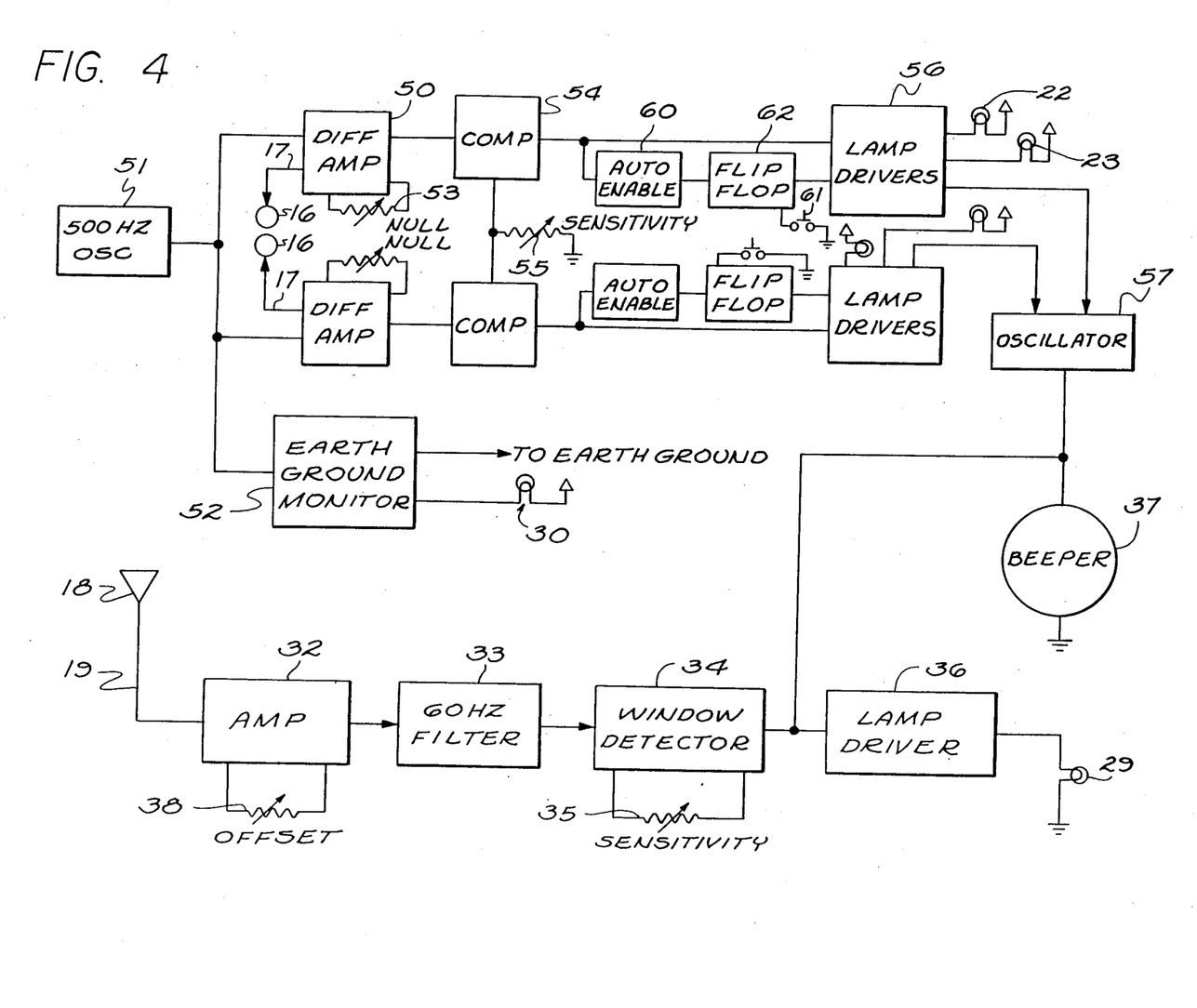
FIG. 4 is an electrical block diagram of the system of FIG. 1.

The static monitoring system of the invention is shown in block diagram form in FIG. 4. The antenna 18 is connected via the cable 19 as an input to the amplifier 32. The cable 19 preferably is a coaxial polyethylene insulated cable. The output of the amplifier 32 is connected through a filter 33 to a window detector 34. A variable resistance 35 provides a sensitivity adjustment for the detector and controls the window size. The output of the window detector controls the static alarm lamp 29 through a lamp driver 36, and directly controls an audible alarm beeper 37. In the preferred embodiment illustrated, there is a direct connection from the lamp 29 to the power supply because a high intensity lamp is used, which lamp draws considerable current when switched on. Another variable resistor 38 provides an offset adjustment for the amplifier 32. For improved stability, a wire wound, multi-turn resistor is preferred for the resistor 38.

In operation, the amplifier 32 functions as a current-to-voltage converter for the signal from the antenna and is configured to be a non-linear operational amplifier so that the system responds to changes in the antenna signal and hence changes in the electrostatic field adjacent the antenna. With this arrangement, the system does not have to precisely measure the actual magnitude of the electrostatic field adjacent the work station or in the work area. Field strength measurement is relatively difficult, while the measurement of change in field is relatively simple. When a charged object, typically a person, approaches there is an increase in the electrostatic field at the work station, which increase produces a corresponding increase in antenna current. This change in antenna current provides the signal which ultimately energizes the lamp 29 and beeper 37. The presently preferred embodiment of the circuit is shown in greater detail in FIG. 7.

The operational amplifier 32 has a feedback circuit including resistors 41, 42, 43 connected in series, with the junction of the resistors 41, 42 connected to ground by diodes 44, 45. The diodes are connected in parallel with opposite polarity to provide a nonlinear feedback to limit response of the amplifier when strong charges are introduced near the antenna.

The junction of the feedback resistors 42, 43 is connected to ground through an integrated circuit 47 which functions as an analog switch. When the system is initially turned on, the integrated circuit 47, controlled by another analog switch 48, functions to make the connection to ground through the resistor 46 in order to set the operational amplifier to the normal state for the ambient field strength. After a short delay, this ground connection is switched to open by the integrated circuit 47 and the operational amplifier functions as described.

The filter 33 is inserted in order to remove substantially all of the signal resulting from line frequency, which usually is 60 hertz. In the preferred embodiment, the detector 34 functions as a window detector with a dead zone about the zero signal level and a maximum for limiting the input to the following driver. In a typical circuit, the dead zone is about ± one volt, which prevents the line frequency ripple and the normal draft and noise from producing an alarm. The window limits are about ± two volts. The sensitivity of the system is controlled by adjusting the variable resistor 35 in order to set the threshold or minimum signal level which will actuate the alarm. When there is an increase in electrostatic field adjacent the antenna of a magnitude to produce a signal at the driver in excess of the preset threshold, the static alarm lamp 29 is energized and the beeper 37 is energized. The audible sound from the beeper calls the operator's attention to a problem, and the particular lamp 29 identifies this problem.

The sensitivity and response on this system is such that an alarm is sounded on approach of a charge well prior to the time that the charge is sufficiently close to the work station to cause damage to the product.

Returning to the block diagram of FIG. 4, the wrist strap 16 is connected as one input to a differential amplifier 50, with the other input being provided by an oscillator 51, typically operating at about 500 hertz. The oscillatory frequency is selected to be well above that of the line frequency, in order to reduce or eliminate line frequency interference. At the same time, the oscillator frequency should not be so high as to make the capacitances involved very difficult to handle. The preferred frequency range is about 200–800 hertz. The output of the oscillator 51 is also connected to an earth ground unit 52 which functions to energize the earth ground lamp 30 when there is not a proper electrical connection between the circuitry of the system and an earth ground.

A variable resistor 53 provides for adjusting the output of the differential amplifier 50 to a null for the condition with the wrist strap attached to an operator. The amplifier output is connected as input to a comparator 54 having another variable resistor 55 for adjusting the sensitivity of the comparator. The comparator output is connected as the input to a lamp driver circuit 56 which provides an output for energizing the lamps 22, 23 of the operator section, and energizing an oscillator 57 which provides a pulsed input to the beeper 37. This arrangement permits using a single beeper 37 which produces a continuous tone when energized by the detector 34 and a variable tone when energized by one of the drivers 56.

An automatic enable unit 60 automatically enables a flip/flop 62 when a wrist strap is picked up from the work bench and attached to an operator. A manually actuated switch means 61 is connected to the flip/flop 62 for turning on and off the indicator lamps and beeper.

The circuitry just described comprises the wrist strap circuit for the operator. An identical circuit is shown in FIG. 4 and in FIGS. 6 and 7 for the wrist strap circuit for the supervisor.

The purpose of the wrist strap is to electrically maintain the operator at ground so that there is no potential existing between the operator and the components resting on the work bench and being manipulated by the operator. The circuit just described provides an alarm when there is no earth ground in the system and also provides an alarm when the wrist strap ground is not properly attached to the operator and/or not functioning properly. The circuit of the invention achieves these aims while being substantially unaffected by electrical noise and provides a fail safe operation so that any malfunction of the system will provide an alarm.

Figure 5:
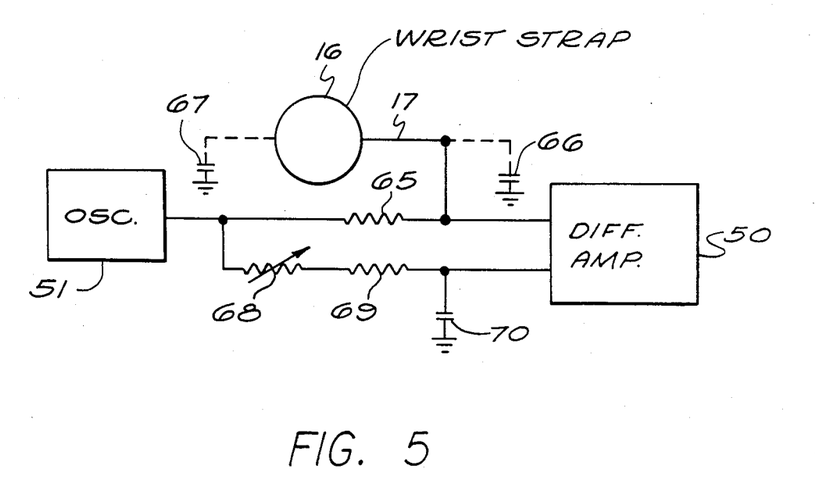
FIG. 5 is an electrical schematic illustrating the connection with the wrist strap.

One of the features of the circuit is the use of phase shift balance measuring in the differential amplifier 50 and this is illustrated in greater detail in the circuit of FIG. 5. The output of the oscillator 51 is connected to one input of the differential amplifier 50 through a resistor 65, with the wrist strap 16 also being connected to this input by the cable 17. There is some stray capacitance between the wrist strap cable and ground, and this is indicated at 66. There is also a capacitance to ground resulting from the operator's body, and this is indicated at 67. The output of the oscillator 51 is also connected to the second input of the differential amplifier through a variable resistor 68 and another resistor 69, with this input also connected to ground through a capacitor 70.

The values for the components 68, 69 and 70 are selected to correspond to the values of the components 65, 66 and 67, so that when the wrist strap is properly in place and functioning, there will be a balance of phase at the two inputs to the differential amplifier. The variable resistor 68 provides for adjustment of this desired balance. Then any change in the electrical characteristics of the wrist strap circuit will produce a phase shift between the inputs to the differential amplifier, resulting in an output which will energize the alarm circuit, such as by changing an indicator light from safe to fail and/or producing an audible sound.

Referring now to the circuit diagram of FIG. 6, the output of the oscillator 51 is connected through a resistor 74 to earth ground at 75. Typically this will be a direct electrical connection to a cold water pipe. Under normal operating conditions, the signal through the resistor 74 is grounded and there is no input to the amplifier 76 of the earth ground unit 52. However if the earth ground connection is open, there will be an input to the amplifier 76 and the earth ground lamp 30 will be energized, providing an indication of a faulty ground.

The differential amplifier 50 is shown as a single unit in FIGS. 4 and 5. In the preferred embodiment of FIG. 6, the operator differential amplifier and the supervisor differential amplifier are provided by five operational amplifiers in a conventional circuit comprising four 324's and one 4558. The 4558 output from the differential amplifier is rectified and compared with a reference level in the comparator unit 54. When the phase shift unbalance signal from the differential amplifier exceeds a predetermined level, as determined by the comparator, an output is provided to the lamp driver 56. When the system is on with minimum phase shift unbalance, the green or safe lamp 23 is energized. When the unbalance exceeds the predetermined value, the output from the comparator on line 77 causes the transistors of the driver 56 to change state, de-energizing the lamp 23 and energizing the red or fail lamp 22.

The lamp driver is enabled by a transistor switch 78, which switch is controlled by the automatic enable unit shown in detail on FIG. 7. The output line 77 from the comparator 54 is also connected as an input to the automatic enable unit 60. When the operator wrist strap is in place and there is no phase unbalance, the signal on line 77 at the input to the unit 60 provides a signal at the output on line 79 which actuates the switch 78 and enables the lamp driver 56. When the operator approaches the work station with the wrist strap resting on the work bench, neither the fail nor the safe light is energized. When the operator picks up the wrist strap from the work bench and attaches it to the wrist, the safe and fail lamps are now enabled and one or the other is energized depending upon the state of the system. Thus the operator does not have to perform any function to bring the system into operation.

The analog switch 48a, which is controlled by the switch 48 to close the switch 48a at power on for a short time, always places the flip-flop 62 in the disabled state.

In the embodiment illustrated, the switch unit 61 comprises a first switch mounted with the green or safe indicator 23 and a second switch mounted with the red or fail indicator 22. Each switch has a set of normally closed contacts and a set of normally open contacts, as indicated at 61 in FIG. 6. When the beeper for the wrist strap section is energized, it continues to operate until shut-off. This is accomplished by depressing the switches of both the red and green lights, which opens the circuit betwen the terminals BEEP1 and BEEP2, which in turn actuates the flip/flop 62 and shuts down the oscillator 57. Also, actuation of either of the red or green switches will close a circuit between terminals OP-EN1 and OP-EN2 and change the output from the autoenable unit and thereby de-energize both indicator lamps.

To ensure that the wrist straps are functioning and the operator and/or supervisor are connected, the wrist strap monitor senses the effect of both the operator and the supervisor on the wrist strap lines. In addition, it monitors the difference between earth ground and electrical ground to ensure the connections to ground.

The device detects a person picking up the wrist strap and automatically enables, indicated by a safe condition (green lamp). If for any reason the wrist strap should fail or the person lose connection to the wrist strap monitor, a red lamp is illuminated and an audible alarm is activated until a safe condition is restored or the unit is disabled. The unit is enabled/disabled by pressing either of the fail or safe buttons.

The static monitor utilizes a static antenna to map the bench work surface for potentially hazardous charges. When power is first applied, the antenna attempts to neutralize any charges in the vicinity of the work area and constantly looks for static disturbances in the work area. Charges entering the area instantly set off the constant tone static alarm long before they present any threat to static sensitive components in the work area. A sensitivity adjustment is provided to control static level at which the alarm sounds.

The static unit once installed, operating at normal sensitivities, will easily detect and alarm when individuals approach the bench wearing wool clothing, rubber soled shoes (tennis shoes on carpeting), silk tops, etc. Chairs with hard rubber casters cannot be rolled on conventional carpeting near the bench, nor can CRT monitors and other static producing instruments be allowed in the vicinity of a static controlled work station without detection by the static monitoring system.

I claim:

1. In a static monitoring system for use with a work station for measuring change in electrostatic potential adjacent the work station, the combination of:
    an antenna;

means for positioning said antenna adjacent the work station for producing a change in current in said antenna as a function of movement of a statically charged object in the electrostatic field adjacent the work station;

a first amplifier having at least one input and an output, said first amplifier having a non-linear feedback circuit from said output to said one input thereof;

means for connecting said antenna to said one input of said first amplifier;

a line frequency filter having said output of said first amplifier as an input;

a signal level detector having the output of said filter as an input; and an alarm unit having the output of said detector as an input;

said first amplifier being a non-linear operational amplifier whereby said alarm unit is actuated when the change in the current in said antenna exceeds a predetermined value.

2. A system as defined in claim 1 wherein said first amplifier
feedback circuit includes resistors serially connected at a junction point, and
first and second rectifiers connected in parallel and in opposite polarity between said junction point and circuit ground to obtain the non-linear characteristic of said non-linear feedback circuit.

3. A system as defined in claim 2 including an amplifier neutralizing circuit for initially setting said first amplifier to a null condition,
said neutralizing circuit including a grounding circuit connecting said feedback circuit to circuit ground when said system is turned on, and
a time delay circuit in said grounding circuit which time delay circuit opens the gounding circuit connection to circuit ground a predetermined time after said system is turned on.

4. A system as defined in claim 3 wherein said signal level detector includes a window detector, said window detector including means defining a first dead zone providing no output for input signals from said filter to the input of said detector of a value of either polarity less than that of said first zone; and
means defining a second output zone providing a varying output for said input signals of a value exceeding the value of said first zone and less than the value of said second zone, and a constant output for said input signals of a value exceeding the value of said second zone.

5. A system as defined in any of the preceding claims wherein said work station includes a work bench with an edge for an operator, and
said antenna comprises an electrical conductor spaced from said work station and horizontally disposed along and spaced above said work bench and facing said edge.

6. A system as defined in claim 1, including in combination:

an electrical conductor adapted for connection to an operator;

an oscillator;

a second amplifier having first and second inputs and an output;

first and second resistors;

means connecting the output of said oscillator to said first input of said second amplifier through said first resistor and to said second input of said second amplifier through said second resistor;

a first capacitor connected between said second input of said second amplifier and ground;

means for connecting said electrical conductor to said first input of said second amplifier;

a comparator circuit having said output of said second amplifier and a reference signal as inputs and providing an output when said output of said second amplifier exceeds a preset value; and means for connecting said output of said comparator circuit to said alarm unit;

said second amplifier being a differential amplifier providing an output varying as a function of the phase difference between the signals at said two inputs thereof.

7. A system as defined in claim 6 including an earth ground connection means, said earth ground connection means including:
an earth ground indicator;
amplifier means for energizing said earth ground indicator; and
circuit means for connecting said output of said oscillator to said amplifier means as an input and to earth ground,
whereby said output of said oscillator is shunted from said amplifier means when said output of said oscillator is connected to earth ground, and said output of said oscillator drives said amplifier means to energize said earth ground indicator when said output of said oscillator is not connected to earth ground.

8. A system as defined in claim 7 wherein said alarm unit includes safe and fail indicators, and
said system includes an autoenable unit for automatically enabling said safe and fail indicators when an operator picks up said electrical conductor, said autoenable circuit including:
first circuit means for disabling said safe and fail indicators;
second circuit means for producing a control signal for actuating said first circuit means to discontinue disabling said safe and fail indicators; and
third circuit means for connecting said output of said comparator circuit as an input to said second circuit means in controlling relation so that said second circuit means produces said control signal when said electrical conductor is moved by the operator out of contact with ground, thereby enabling said safe and fail indicators.

9. A system as defined in claim 8 wherein said second circuit means includes switch means for manually switching said second circuit means to a state for disabling said safe and fail indicators.

* * * * *

UNITED STATES PATENT AND TRADEMARK OFFICE
CERTIFICATE OF CORRECTION

PATENT NO. : 4,785,294

DATED : November 15, 1988

INVENTOR(S) : Jeffrey D. Campbell, et al.

It is certified that error appears in the above-identified patent and that said Letters Patent is hereby corrected as shown below:

The title page showing the illustrative figure should be deleted to appear as per attached title page.

Signed and Sealed this

Fifth Day of June, 1990

Attest:

HARRY F. MANBECK, JR.

*Attesting Officer*   Commissioner of Patents and Trademarks

United States Patent [19]

Campbell

[11] Patent Number: 4,785,294
[45] Date of Patent: Nov. 15, 1988

[54] STATIC MONITORING SYSTEM
[75] Inventor: Jeffrey D. Campbell, Hawthorne, Calif.
[73] Assignee: Zero Corporation, Burbank, Calif.
[21] Appl. No.: 877,873
[22] Filed: Jun. 24, 1986
[51] Int. Cl.⁴ .............................................. G08B 21/00
[52] U.S. Cl. ..................................... 340/649; 340/561; 340/650; 340/661; 340/635
[58] Field of Search ................ 340/565, 561, 562, 563, 340/541, 564, 573, 649, 650, 635, 661; 361/222, 220, 214, 215, 212

[56] References Cited

U.S. PATENT DOCUMENTS

| | | | |
|---|---|---|---|
| H330 | 9/1987 | Burich et al. | 340/649 |
| 3,973,208 | 8/1976 | Diamond | 340/562 |
| 4,366,473 | 12/1982 | Inoue et al. | 340/562 |
| 4,558,309 | 12/1985 | Antonevich | 340/649 |
| 4,638,399 | 1/1987 | Maroney et al. | 340/649 |
| 4,649,374 | 3/1987 | Hoigaard | 340/573 |
| 4,684,931 | 8/1987 | Parks | 340/563 |
| 4,710,751 | 12/1987 | Webster | 340/562 |

OTHER PUBLICATIONS

Single page ad of Voyager Technologies, Inc.
Quarter page ad of Semtronics.
Two page ad of Simco Model M400.
Two page ad of Electro-Tech Systems, Inc. Model 6025.
Two page ad of Trek Model 1800 and Model 150.
Twelve page catalog of Trek.
Three page ad for Simco Aerostat.

Primary Examiner—John W. Caldwell, Sr.
Assistant Examiner—Tyrone Queen
Attorney, Agent, or Firm—Harris, Kern, Wallen & Tinsley

[57] ABSTRACT

A static monitoring system for use with an electronic manufacturing work area, typically a conventional work bench having an electrical conducting strap for connecting the operator's wrist to earth ground, and including a circuit for indicating when there is an earth ground connection and circuitry for indicating when an electrostatically charged object, such as another human, approaches the work station. An antenna is positioned at the work station spaced from the working surface and from the operator, with the antenna connected as an input to an amplifier circuit which measures the change in electrostatic field strength and hence the approach of a charged object, with an indicator providing a visual or audible alarm or both. An oscillator provides an ac signal to each input of a differential amplifier, with one input connected to circuit ground through a capacitor and the other input connected to a wrist strap or the like on the operator. Phase difference at the amplifier inputs is detected as a measure of the capacitance to ground at the wrist strap thereby indicating appropriate use of the wrist strap.

9 Claims, 7 Drawing Sheets

UNITED STATES PATENT AND TRADEMARK OFFICE
CERTIFICATE OF CORRECTION

PATENT NO. : 4,785,294

DATED : November 15, 1988

INVENTOR(S) : Jeffrey D. Campbell

Figure 2:
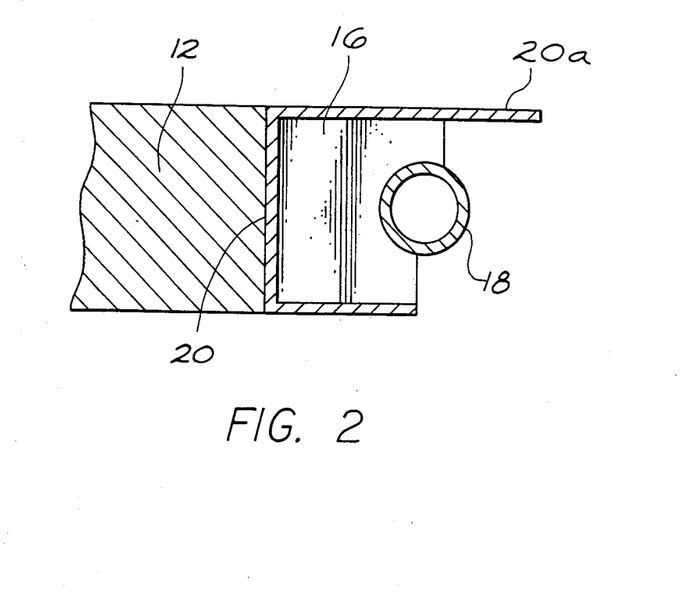
FIG. 2 is an enlarged partial sectional view taken along the line 2—2 of FIG. 1.
Figure 6:
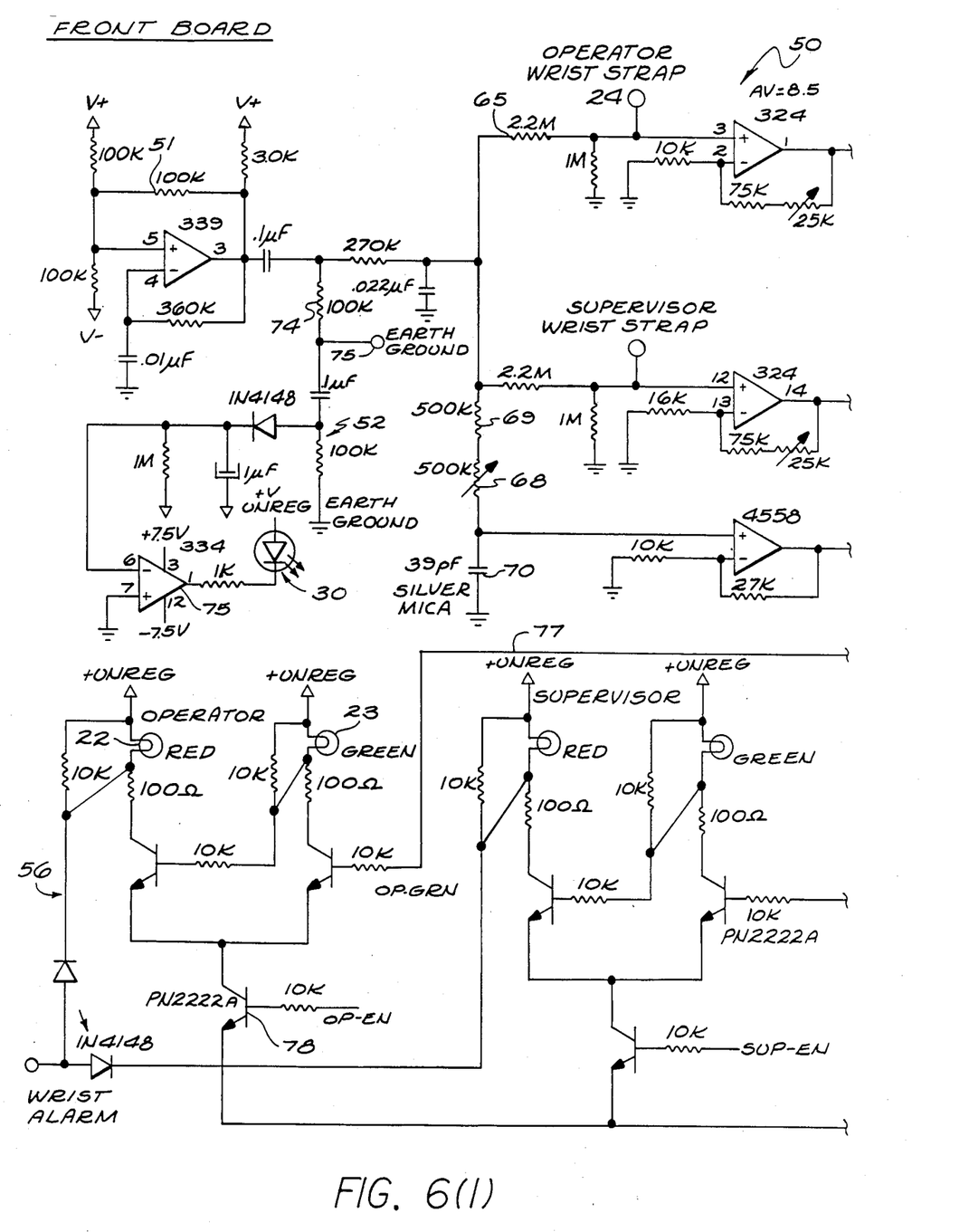
Figure 7:
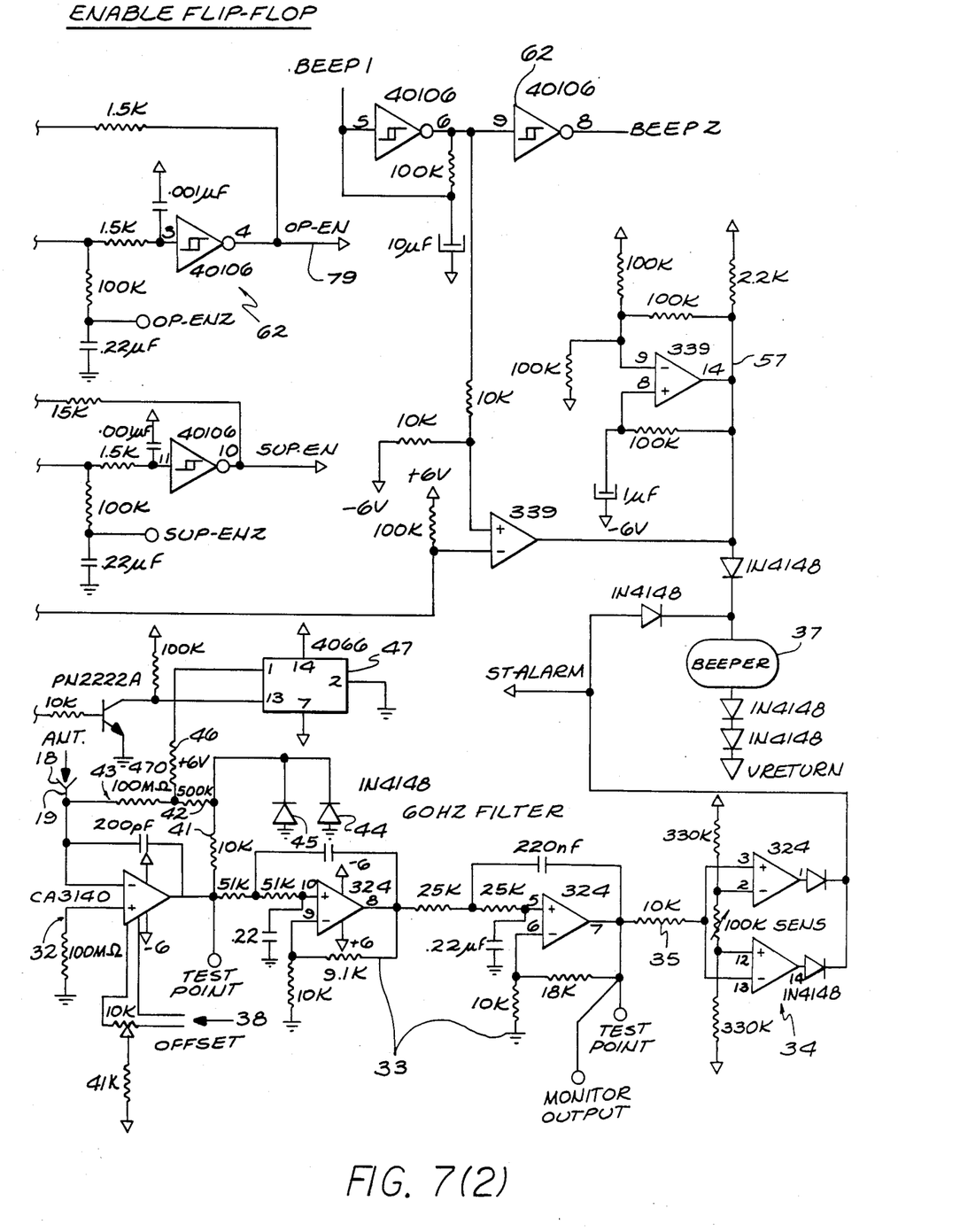
Figure 7I:
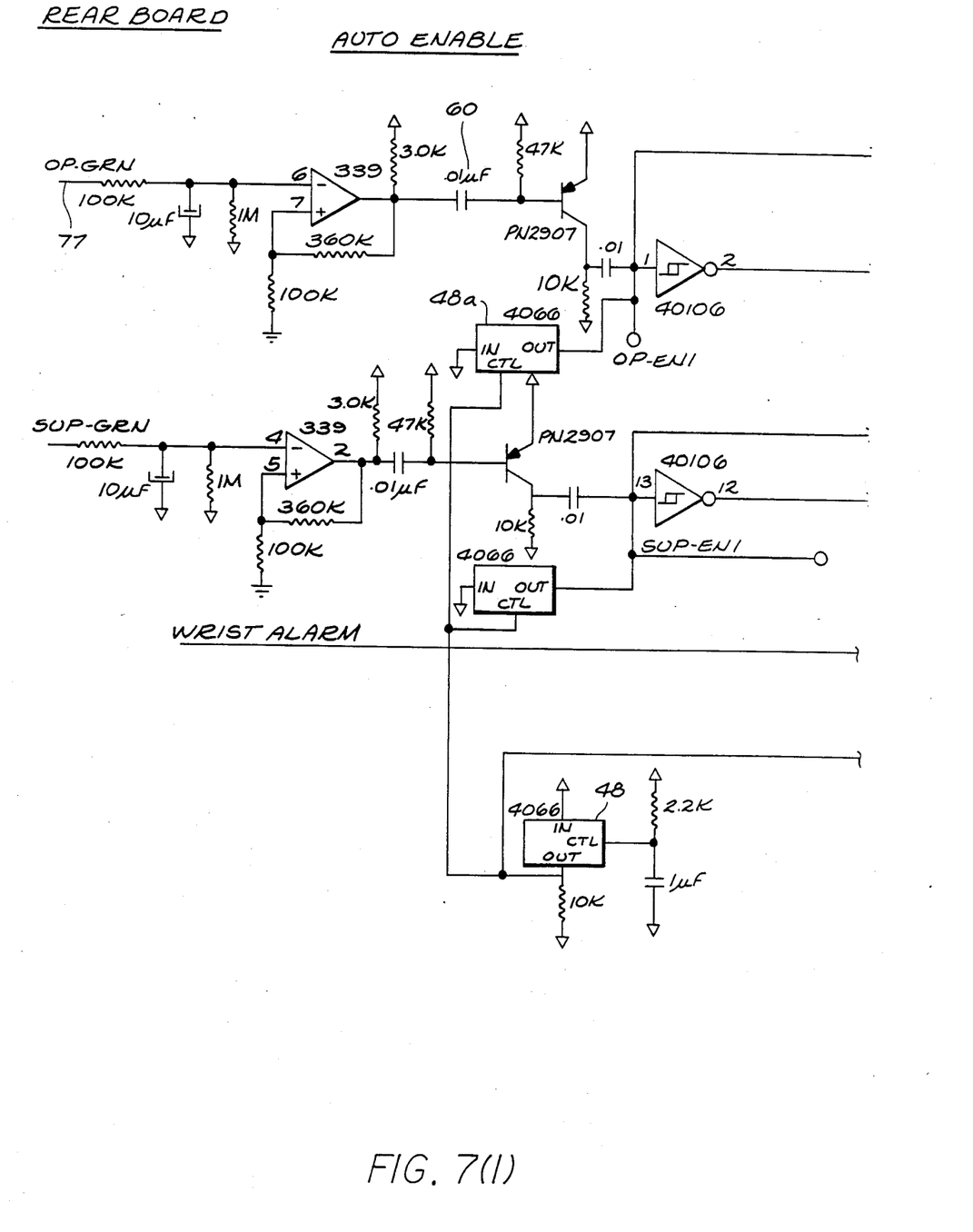

It is certified that error appears in the above-identified patent and that said Letters Patent is hereby corrected as shown below:

Substitute Figs. 1, 2, 6(1) and 7(2) below for Figs. 1, 2, 6(1) and 7(2) of the patent as issued.

FIG. 1

UNITED STATES PATENT AND TRADEMARK OFFICE
CERTIFICATE OF CORRECTION

PATENT NO. : 4,785,294

DATED : November 15, 1988

INVENTOR(S) : Jeffrey D. Campbell

It is certified that error appears in the above-identified patent and that said Letters Patent is hereby corrected as shown below:

FIG. 2

UNITED STATES PATENT AND TRADEMARK OFFICE
CERTIFICATE OF CORRECTION

PATENT NO. : 4,785,294　　　　　　　　　　　Page 5 of 6

DATED : November 15, 1988

INVENTOR(S) : Jeffrey D. Campbell

It is certified that error appears in the above-identified patent and that said Letters Patent is hereby corrected as shown below:

FIG. 6(1)

UNITED STATES PATENT AND TRADEMARK OFFICE
CERTIFICATE OF CORRECTION

PATENT NO. : 4,785,294            Page 6 of 6

DATED : November 15, 1988

INVENTOR(S) : Jeffrey D. Campbell

It is certified that error appears in the above-identified patent and that said Letters Patent is hereby corrected as shown below:

FIG. 7(2)